United States Patent
Yamazaki et al.

(10) Patent No.: US 8,191,216 B2
(45) Date of Patent: Jun. 5, 2012

(54) VIBRATING PIECE MANUFACTURING METHOD AND VIBRATOR MANUFACTURING METHOD

(75) Inventors: Takashi Yamazaki, Shiojiri (JP); Tsukasa Funasaka, Shiojiri (JP); Takeo Funakawa, Chino (JP); Makoto Furuhata, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 588 days.

(21) Appl. No.: 12/349,201

(22) Filed: Jan. 6, 2009

(65) Prior Publication Data

US 2009/0178260 A1    Jul. 16, 2009

(30) Foreign Application Priority Data

Jan. 15, 2008   (JP) ................. 2008-005768

(51) Int. Cl.
  *H04R 17/10*   (2006.01)
  *C23F 1/02*   (2006.01)

(52) U.S. Cl. ........ 29/25.35; 29/594; 29/896.22; 29/846; 310/370; 216/41; 216/52

(58) Field of Classification Search ............... 29/25.35, 29/594, 896.22, 846, 847; 310/348, 370, 310/378; 216/41, 52; 438/778
See application file for complete search history.

(56) References Cited

U.S. PATENT DOCUMENTS

| | | | |
|---|---|---|---|
| 5,227,339 A * | 7/1993 | Kishii ................. | 216/52 X |
| 6,617,261 B2 * | 9/2003 | Wong et al. ................. | 438/778 |
| 6,915,548 B2 * | 7/2005 | Kawashima ................. | 29/25.35 |
| 7,002,284 B2 | 2/2006 | Ouchi et al. | |
| 7,083,740 B2 | 8/2006 | Nakatani et al. | |
| 7,387,025 B2 | 6/2008 | Nozoe | |

FOREIGN PATENT DOCUMENTS

| | | | | |
|---|---|---|---|---|
| JP | 58157211 A | * | 9/1983 | ....... 29/25.35 |
| JP | A-2002-252546 | | 9/2002 | |
| JP | A-2003-227719 | | 8/2003 | |
| JP | A-2004-79869 | | 3/2004 | |
| JP | A-2005-233706 | | 9/2005 | |
| JP | A-2009-5022 | | 1/2009 | |

* cited by examiner

*Primary Examiner* — A. Dexter Tugbang

(74) *Attorney, Agent, or Firm* — Oliff & Berridge, PLC

(57) ABSTRACT

A vibrating piece manufacturing method includes: (a) preparing a supporting body having first and second surfaces, the first and second surfaces defining a thickness while being directed toward opposite directions, the supporting body including a base and a plurality of arms, the arms extending side-by-side in a direction orthogonal to a direction of the thickness from the base, a lower electrode film being disposed on the first surface of each of the arms, a piezoelectric film being disposed on the lower electrode films, at least one upper electrode film being disposed on the piezoelectric film, at least a part of the second surface of each of the arms being an exposed area; and (b) etching the exposed area of the second surface so as to reduce the thickness to reduce flexural rigidity of the arms with respect to the thickness direction.

3 Claims, 5 Drawing Sheets

VIBRATING PIECE MANUFACTURING METHOD AND VIBRATOR MANUFACTURING METHOD

BACKGROUND

1. Technical Field

The present invention relates to a vibrating piece manufacturing method and a vibrator manufacturing method.

2. Related Art

There has been known a technology for, in order to control the vibration frequency of a vibrating piece for use in an oscillator or the like, eliminating a part of a metal film of a vibrating arm using a laser beam (JP-A-2002-252546). Specifically, by eliminating a part of a metal film, the weight of the metal film is reduced so that the vibration frequency is controlled. However, the amount of control of the vibration frequency obtained by controlling the weight is small. Therefore, the control range is limited.

SUMMARY

An advantage of the invention is to expand the control range of vibration frequency.

A vibrating piece manufacturing method according to a first aspect of the invention includes: (a) preparing a supporting body having first and second surfaces, the first and second surfaces defining a thickness while being directed toward opposite directions, the supporting body including a base and a plurality of arms, the arms extending side-by-side in a direction orthogonal to a direction of the thickness from the base, a lower electrode film being disposed on the first surface of each of the arms, a piezoelectric film being disposed on the lower electrode films, at least one upper electrode film being disposed on the piezoelectric film, at least a part of the second surface of each of the arms being an exposed area; and (b) etching the exposed area of the second surface so as to reduce the thickness to reduce flexural rigidity of the arms with respect to the thickness direction.

By adopting this method, the thickness of the arms is controlled so that the flexural rigidity is controlled. As a result, the vibration frequency is controlled. Since the amount of control of the frequency obtained by controlling the thickness of the arms is larger than that obtained by controlling the weight, the control range of the vibration frequency is expanded.

In the vibrating piece manufacturing method according to the first aspect of the invention, before step (b), a weight metal film is preferably formed on the second surface of each of the arms, and in step (b), a surface of the weight metal film is preferably also etched.

A vibrating piece manufacturing method according to a second aspect of the invention includes: (a) preparing a supporting body having first and second surfaces, the first and second surfaces defining a thickness while being directed toward opposite directions, the supporting body including a base and a plurality of arms, the arms extending side-by-side in a direction orthogonal to a direction of the thickness from the base, a lower electrode film being disposed on the first surface of each of the arms, a piezoelectric film being disposed on the lower electrode films, at least one upper electrode film being disposed on the piezoelectric film, at least a part of the second surface of each of the arms being an exposed area; and (b) forming a reinforcing metal area in the exposed area of the second surface so as to increase flexural rigidity of the arms with respect to the thickness direction.

By adopting this method, the thickness of the arms is controlled so that the flexural rigidity is controlled. As a result, the vibration frequency is controlled. Since the amount of control of the frequency obtained by controlling the thickness of the arms is larger than that obtained by controlling the weight, the control range of the vibration frequency is expanded.

In the vibrating piece manufacturing method according to the first and the second aspects of the invention, the supporting body is preferably made of a piezoelectric material.

A vibrator manufacturing method according to a third aspect of the invention includes (a) preparing a supporting body having first and second surfaces, the first and second surfaces defining a thickness while being directed toward opposite directions, the supporting body including a base and a plurality of arms, the arms extending side-by-side in a direction orthogonal to a direction of the thickness from the base, a lower electrode film being disposed on the first surface of each of the arms, a piezoelectric film being disposed on the lower electrode films, at least one upper electrode film being disposed on the piezoelectric film, at least a part of the second surface of each of the arms being an exposed area; (b) etching the exposed area of the second surface so as to reduce the thickness to reduce flexural rigidity of the arms with respect to the thickness direction; (c) incorporating a vibrating piece manufactured by performing steps (a) and (b), into a package; and (d) covering an opening of the package with a lid.

A vibrator manufacturing method according to a fourth aspect of the invention includes: (a) preparing a supporting body having first and second surfaces, the first and second surfaces defining a thickness while being directed toward opposite directions, the supporting body including a base and a plurality of arms, the arms extending side-by-side in a direction orthogonal to a direction of the thickness from the base, a lower electrode film being disposed on the first surface of each of the arms, a piezoelectric film being disposed on the lower electrode films, at least one upper electrode film being disposed on the piezoelectric film, at least a part of the second surface of each of the arms being an exposed area; (b) forming a reinforcing metal area in the exposed area of the second surface so as to increase flexural rigidity of the arms with respect to the thickness direction; (c) incorporating a vibrating piece manufactured by performing steps (a) and (b), into a package; and (d) covering an opening of the package with a lid.

BRIEF DESCRIPTION OF THE DRAWINGS

The invention will be described with reference to the accompanying drawings, wherein like reference numerals designate like elements.

DESCRIPTION OF EXEMPLARY EMBODIMENTS

First Embodiment

Figure 1A:
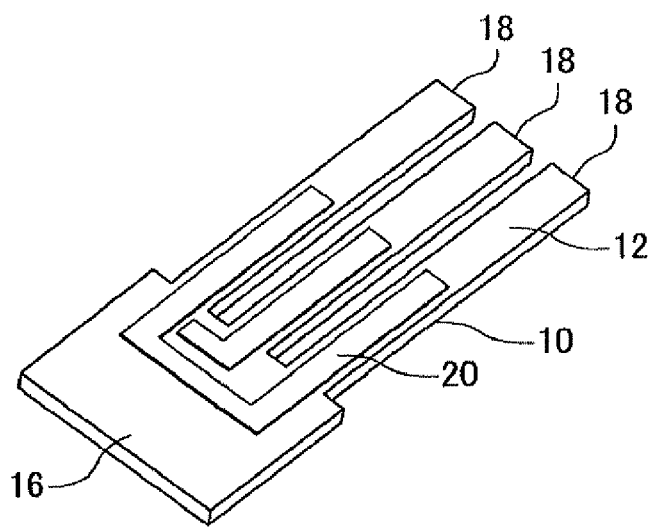
FIGS. 1A to 1C are drawings showing a vibrating piece manufacturing method according to a first embodiment of the invention.

FIGS. 1A to 3 are drawings showing a vibrating piece manufacturing method according to a first embodiment of the invention. In this embodiment, a supporting body 10 is prepared. The supporting body 10 may be made of a piezoelectric material (for example, a Z-cut plate, an AT-cut plate, an X-cut plate) such as quartz or may be made of silicon. The supporting body 10 has first and second surfaces 12 and 14 that define the thickness while being directed toward opposite directions. The supporting body 10 includes a base 16 and multiple (an odd number of) arms 18 extending side-by-side from the base 16 in a direction orthogonal to the thickness direction. While the width of an arm 18 located in the middle of the arms 18 that are lining up may be larger than or equal to the width of the remaining arms 18, all the arms 18 have an identical thickness. This shape is obtained by etching (at least one of wet etching and dry etching) a plate material.

As shown FIG. 1A, a lower electrode film 20 is formed on the first surface 12 of each of the multiple arms 18. The lower electrode films 20 on multiple arms 18 odd-numbered in the direction in which the arms 18 are lining up (hereafter simply referred to as "odd-numbered) are formed so that the lower electrode films extend over the base 16 and are electrically coupled to one another thereon. If there are multiple arms 18 (not shown) even-numbered in the direction in which the arms 18 are lining up (hereafter simply referred to as "even-numbered), the lower electrode films 20 are formed on the multiple even-numbered arms 18 so that the lower electrode films extend over the base 16 and are electrically coupled to one another thereon. The process of forming the lower electrode films 20 may include a process of forming a conductive film by sputtering and then patterning the conductive film by etching. Alternatively, a patterned mask may be formed on the supporting body 10 and then a conductive film may be formed in an area of the supporting body 10 that is not covered with the mask.

Figure 1B:
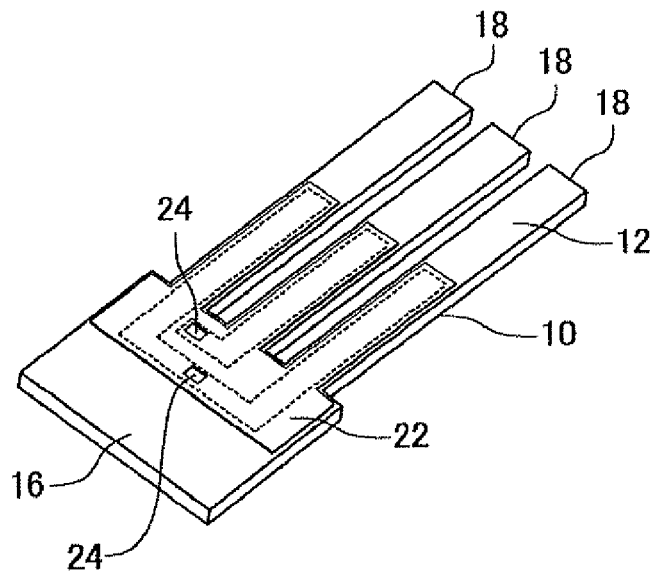

As shown in FIG. 1B, a piezoelectric film 22 is formed on the lower electrode films 20. The piezoelectric film 22 is made of a material exhibiting a high piezoelectric effect. The piezoelectric film 22 entirely covers parts formed on the arms 18, of the lower electrode film 20. An opening 24 is made in the piezoelectric film 22 in such a manner that the position of opening 24 corresponds to a position where parts of the lower electrode films 20 formed on the odd-numbered (or even-numbered) arms 18 are electrically coupled on the base 16. When forming the piezoelectric film 22, the technology for forming the lower electrode films 20 except for a material may be used.

Figure 1C:
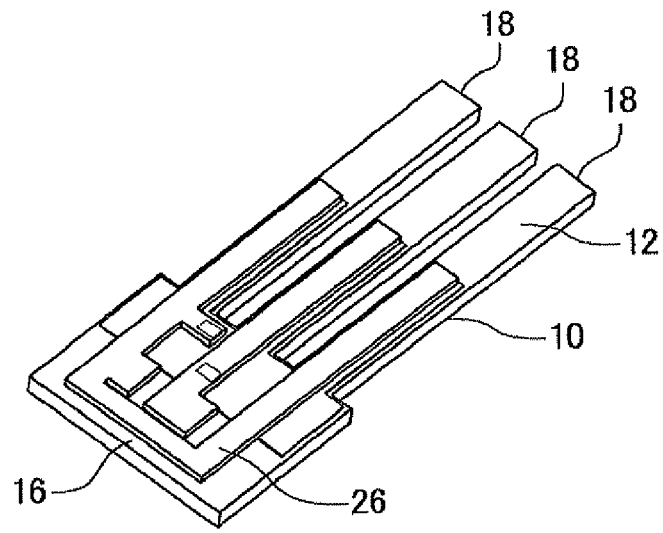

As shown FIG. 1C, upper electrode films 26 are formed on the piezoelectric film 22. The upper electrode films 26 on the multiple odd-numbered arms 18 are formed so that the upper electrode films extend over the base 16 and are electrically coupled to one another thereon. If there are multiple even-numbered arms 18 (not shown), the upper electrode films 26 are formed on the multiple even-numbered arms 18 so that the upper electrode films extend over the base 16 and are electrically coupled to one another thereon. Also, the upper electrode films 26 are electrically coupled to the lower electrode films 20 via the opening 24 of the piezoelectric film 22. Specifically, the lower electrode films 20 formed on the odd-numbered arms 18 are coupled to the upper electrode film 26 formed on the even-numbered arm 18. The lower electrode film 20 formed on the even-numbered arm 18 is coupled to the upper electrode films 26 formed on the odd-numbered arms 18. When forming the upper electrode films 26, the technology for forming the lower electrode films 20 may be used.

Figure 2:
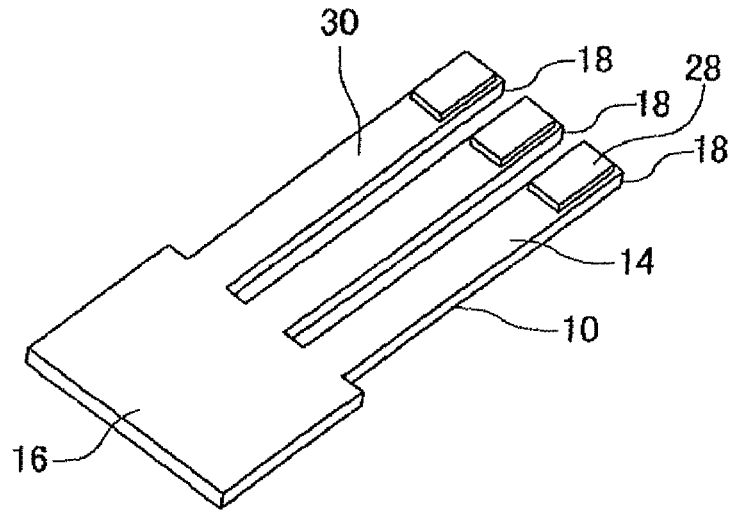
FIG. 2 is a drawing showing the vibrating piece manufacturing method according to the first embodiment.

As shown in FIG. 2, a weight metal film 28 is formed on the second surface 14 of each of the multiple arms 18. The weight metal film 28 is formed at an end remote from the base 16, of each arm 18. The weight metal film 28 is formed so that at least a part of the second surface 14 of each arm 18 is an exposed area 30. That is, no electrode film except for the weight metal film 28 is formed on the second surface 14 of each arm 18.

Figure 3:
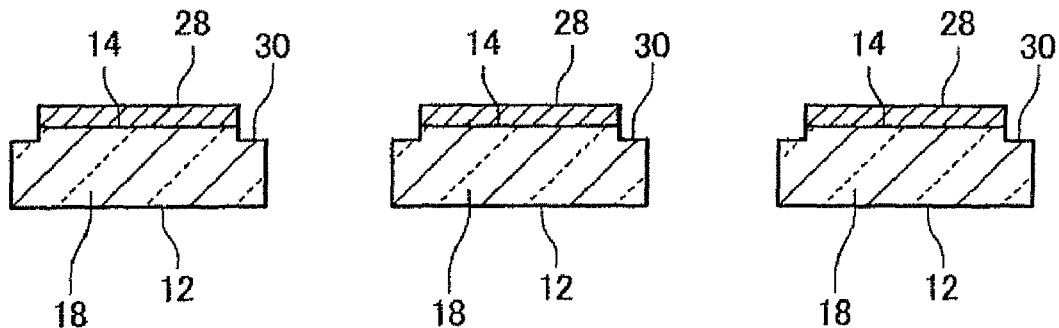
FIG. 3 is a drawing showing the vibrating piece manufacturing method according to the first embodiment.

As shown in FIG. 3, etching is performed on the exposed area 30 of the second surface 14 of each arm 18. As the etching method, dry etching using plasma gas such as $CF_4$ or $C_2F_6$ may be used. When etching the exposed areas 30, the side surfaces (surfaces connecting the first and second surfaces 12 and 14) of each arm 18 may also be etched. If the surfaces of the weight metal films 28 are etched when etching the exposed areas 30, the etching is stopped halfway so that the weight metal films 28 are left. Since the weight metal films 28 serve as masks, the surfaces of parts covered with the weight metal films 28, of the supporting body 10 (arm 18) are not etched. As a result, steps are formed between the surfaces of the parts covered with the weight metal films 28 and the surfaces of the etched parts. Since the parts (edges of the arms 18) covered by the weight metal films 28, of the supporting body 10 are thicker than the etched parts thereof, the parts (edges of the arms 18) act as weights.

By adopting this embodiment, the exposed areas 30 of the second surfaces 14 are etched; therefore, the thickness of the arms 18 is reduced so that the arms 18 are made flexible in the thickness direction. Also, by controlling the thickness of the multiple arms 18, the flexibility of the arms 18 in the thickness direction is controlled so that the vibration frequency is controlled. Since the amount of control of the frequency obtained by controlling the thickness of the multiple arms 18 is larger than that obtained by controlling the weights of the arms 18, the control range of the vibration frequency is expanded.

Flexural rigidity EI with respect to the thickness direction is used as the index of the non-flexibility or flexibility of the multiple arms 18.

Figure 9:
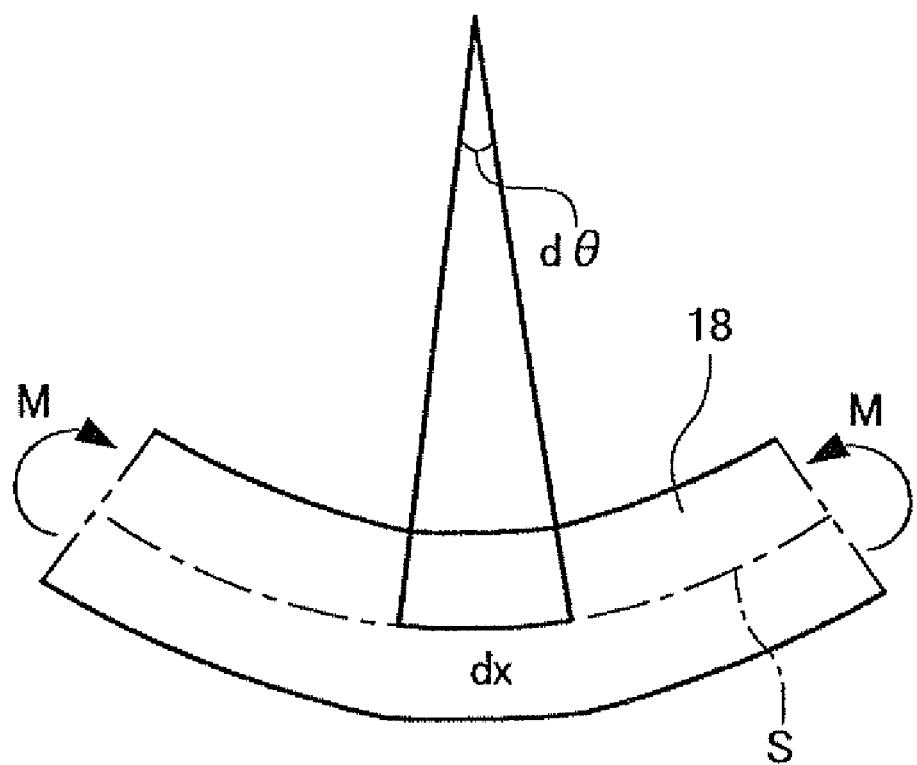
FIG. 9 is a drawing showing a bending moment and a distortion of an arm.

As shown in FIG. 9, if an arm 18 (a beam in a broad sense) is statically distorted at a curvature $1/\rho(=d\theta/dx)$ when a bending moment M (S indicates a neutral surface) is applied to the arm 18, the following relation exists.

$$1/\rho = M/EI$$

where E is a Young's modulus specific to a material and I is a geometrical moment of inertia.

As flexural rigidity EI is made higher, the arm 18 becomes less flexible.

The geometrical moment of inertia I is the sum of values obtained by multiplying a minute sectional element dA by the square of a distance y from a neutral axis AX where tensile stress is zero when the arm is bent. The geometrical moment of inertia I is represented by the following formula.

$$I=\int_A y^2 dA$$

Figure 10:
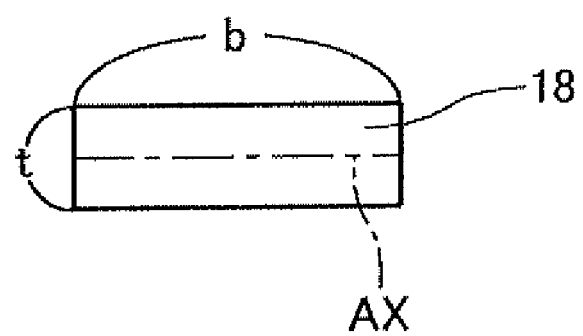
FIG. 10 is a drawing showing a geometrical moment of inertia.

As shown in FIG. 10, the geometrical moment of inertia $I_t$ of the arm 18 having a rectangular section having a side that is parallel with the neutral axis AX and has a length (width) b and a side that is perpendicular to the neutral axis AX and has a length (thickness) t is obtained as $I_t=bt^3/12$. Therefore, the geometrical moment of inertia and flexural rigidity with respect to the thickness direction are each proportionate to the cube of the thickness t of the arm 18. Therefore, by controlling the thickness, the flexibility in the thickness direction is controlled to a larger extent.

A vibration frequency F of the arm in the thickness direction, a length L of the arm 18, and the thickness t (thickness in the vibration direction) of the arm 18 have the following relation.

$$F=k \cdot t/L^2$$

where k is a proportionality constant.

Note that a change in thickness of the arm 18 does not affect the vibration frequency in the width direction.

Figure 4:
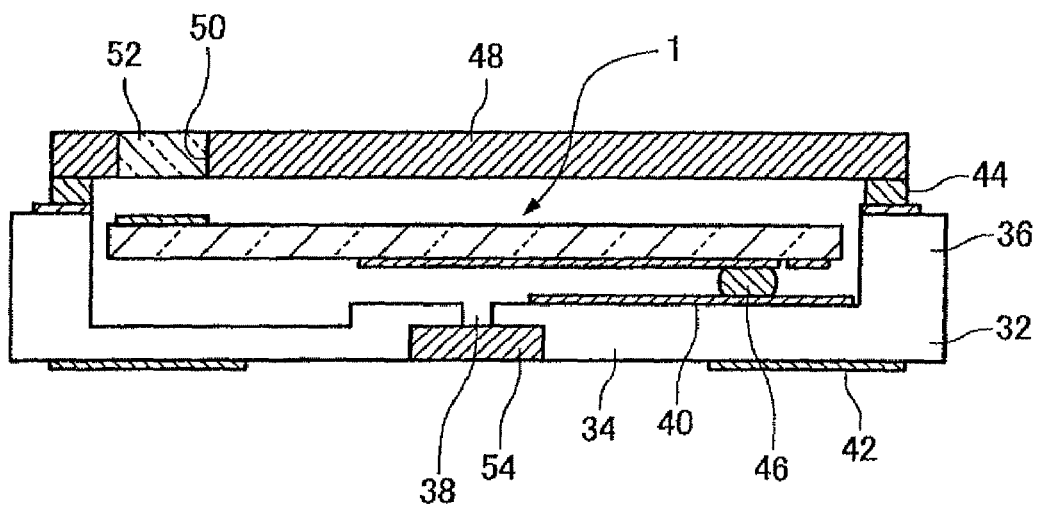
FIG. 4 is a drawing showing the vibrator manufacturing method according to the first embodiment.

FIG. 4 is a drawing showing a vibrator manufacturing method according to the first embodiment. By performing the above-mentioned process in this embodiment, the exposed areas 30 of the second surfaces 14 are etched so that the thickness is reduced. As a result, a vibrating piece 1 whose multiple arms 18 are flexible in the thickness direction is obtained.

In the vibrator manufacturing method according to this embodiment, a package 32 is prepared. The package 32 includes a bottom 34 for fixing the vibrating piece 1 and a frame wall 36 surrounding the bottom 34. All of the package 32 may be made of a metal. If the package 32 is mainly made of a nonmetal such as ceramics, the upper edge surface of the frame wall 36 is metalized. An air vent 38 for evacuation is formed in the bottom 34. A fixed electrode 40 is formed on the inner surface of the package 32 (bottom 34). An external terminal 42 is formed on the outer surface of the package 32 (bottom 34). The fixed electrode 40 and external terminal 42 are electrically coupled via wiring (not shown). The external terminal 42 is implemented on a wiring pattern (not shown) of a circuit substrate by soldering or the like. A ring 44 is fixed to the frame wall 36 of the package 32 by brazing.

Subsequently, the vibrating piece 1 is incorporated into the package 32. The vibrating piece 1 is disposed in such a manner that the first surface 12 is directed toward the bottom 34 and that the upper electrode films 26 are opposed to the fixed electrode 40. Also, the vibrating piece 1 is fixed in such a manner that the arms 18 extend from the base 16 toward the frame wall 36. The base 16 is fixed to the bottom 34 so that the arms 18 float in the package 32. An area opposed to the ends of the arms 18, of the bottom 34 is lowered. Thus, even if the arms 18 are bent, it is difficult for the arms 18 to make contact with the bottom 34.

The vibrating piece 1 is fixed to the package 32 using a bonding material 46. The bonding material 46 may be a metal material such as a conductive resin material or solder. In this case, a metal material is preferably used, since it does not emit gas even if it is heated. The bonding material 46 bonds the base 16 and package 32 together so that the arms 18 are kept floating in the package 32. The bonding material 46 connects the upper electrode films 26 formed on the base 16 and the fixed electrode 40 electrically and mechanically.

A lid 48 is fixed to the ring 44. The lid 48 blocks an opening of the package 32, to which the vibrating piece 1 is fixed, while overlapping the package 32. The lid 48 has a through hole 50 penetrating through the front surface thereof and back surface thereof. The opening of the through hole 50 takes the shape of a circle. The lid 48 includes a light-transmissive material 52 made of a material such as glass or a resin. The through hole 50 adheres to the inner surface facing the through hole 50, of the lid 48.

After blocking the opening of the package 32 with the lid 48, the package 32 is evacuated via the air vent 38 formed on the package 32. Subsequently, the air vent 38 is blocked by a brazing material 54.

The vibrator measuring method further includes a step of eliminating parts of the weight metal films 28 formed at the ends of the arms 18. This step is performed after (or after an evacuation step is further performed) the opening of the package 32 is blocked by the lid 48. In this step, a laser beam is applied to the weight metal films 28 via the light-transmissive material 52. Thus, the weights of the weight metal films 28 are reduced. As the ends of the arms 18 at which the weight metal films 28 are formed are made heavier, the vibration frequency of the arms 18 becomes lower. As the ends of the arms 18 are made lighter, the vibration frequency becomes higher. The vibration frequency is controlled using this fact. The above-mentioned frequency control performed by etching the arms 18 is called "coarse control" and the above-mentioned frequency control performed by trimming the weight metal films 28 is called "fine control."

Figure 5:
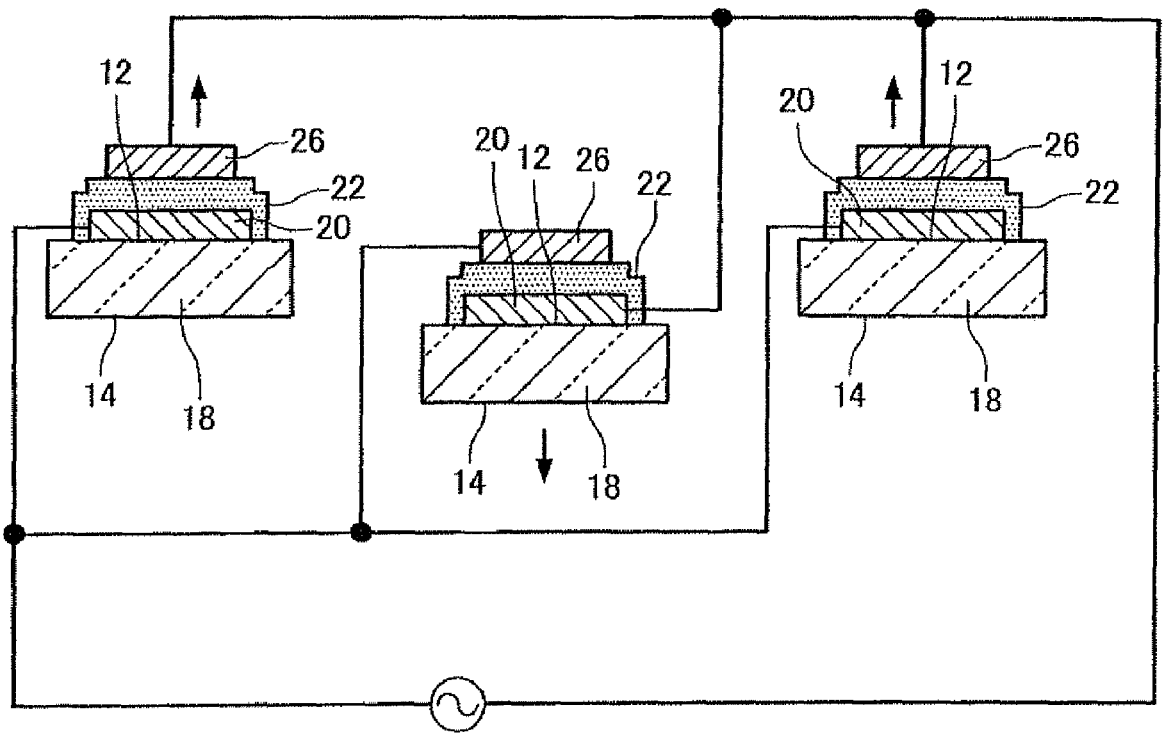
FIG. 5 is a drawing showing operations of a vibrator manufactured using the manufacturing method according to the first embodiment.

FIG. 5 is a drawing showing operations of a vibrator manufactured using the manufacturing method according to the first embodiment. The vibrator manufactured according to this embodiment includes elements obvious from the above-mentioned process.

In this embodiment, the upper electrode films 26 and lower electrode films 20 are coupled to an alternating current power supply via cross-wiring so that an alternating voltage serving as a drive voltage is applied to these electrode films. The upper electrode films 26 formed on the odd-numbered arms 18 and the lower electrode film 20 formed on the even-numbered arms 18 have an identical potential. The lower electrode films 20 formed on the odd-numbered arms 18 and the upper electrode film 26 formed on the even-numbered arms 18 have an identical potential. By applying a voltage between the upper electrode films 26 and lower electrode films 20 so as to expand and contract the piezoelectric film 22, the arms 18 of the supporting body 10 are bending-vibrated. The arms 18 are bent in a direction toward which the first surface or second surface 14 is directed. When the arms 18 are driven at the natural vibration frequency of fundamental mode, the odd-numbered arms 18 and even-numbered arms 18 are excited so that these arms vibrate in opposite phases, and are bending-vibrated.

An oscillator or a sensor may be configured using a vibrator manufactured using the manufacturing method according to this embodiment. By configuring an oscillator using an oscillation circuit including such a vibrator, an alternating current signal having a high frequency accuracy is obtained. A sensor using the above-mentioned vibrator is a sensor for detecting a physical amount depending on which the frequency of the vibrating piece varies. Among examples of such a sensor are sensors for detecting stress caused by a temperature or an acceleration, Coriolis force caused by an angular velocity, or the like.

First Modification

Figure 6:
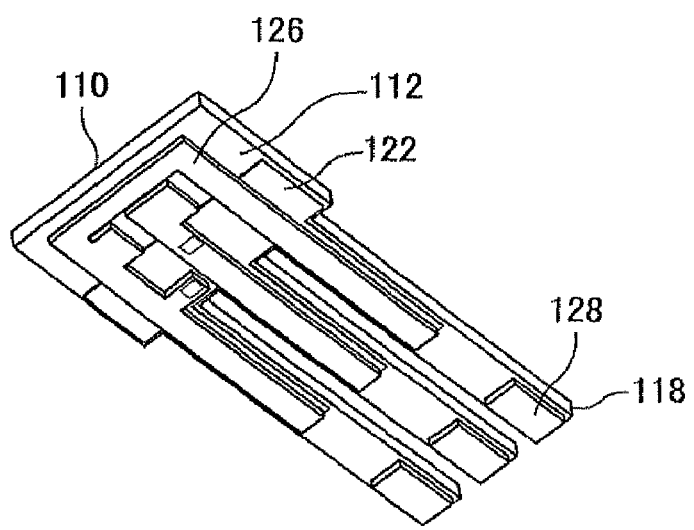
FIG. 6 is a drawing showing a first modification of the vibrating piece manufacturing method according to the first embodiment.

FIG. 6 is a drawing showing a first modification of the vibrating piece manufacturing method according to the first embodiment. In this modification, weight metal films 128 are formed on a first surface 112 having lower electrode films (not shown), a piezoelectric film 122, and upper electrode films 126, while no weight metal films are formed on a second surface (back surface of FIG. 6). In this case, all of the second surface of each of arms 118 may be an exposed area where the material of a supporting body 110 is exposed. Subsequently, etching is performed on the exposed areas of the second surface of the supporting body 110. The second surface is flattened due to the etching. Other steps of this modification may be the steps described in the above-mentioned embodiment. Thus, also in this modification, the thickness of the arms 118 is reduced so that the frequency is controlled.

Second Modification

Figure 7:
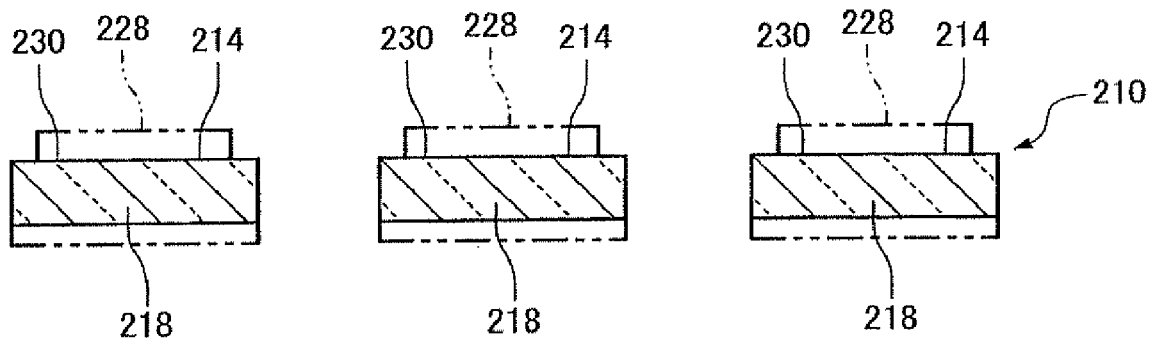
FIG. 7 is a drawing showing a second modification of the vibrating piece manufacturing method according to the first embodiment.

FIG. 7 is a drawing showing a second modification of the vibrating piece manufacturing method according to the first embodiment. In this modification, a supporting body 210 where no weight metal films are formed on a second surface 214 is prepared. Subsequently, etching is performed on exposed areas 230 of the second surfaces 214 and then weight metal films 228 are formed on the second surfaces 214. Other steps of this modification may be the steps described in the above-mentioned embodiment. Thus, also in this modification, the thickness of arms 218 is reduced so that the frequency is controlled.

Second Embodiment

Figure 8:
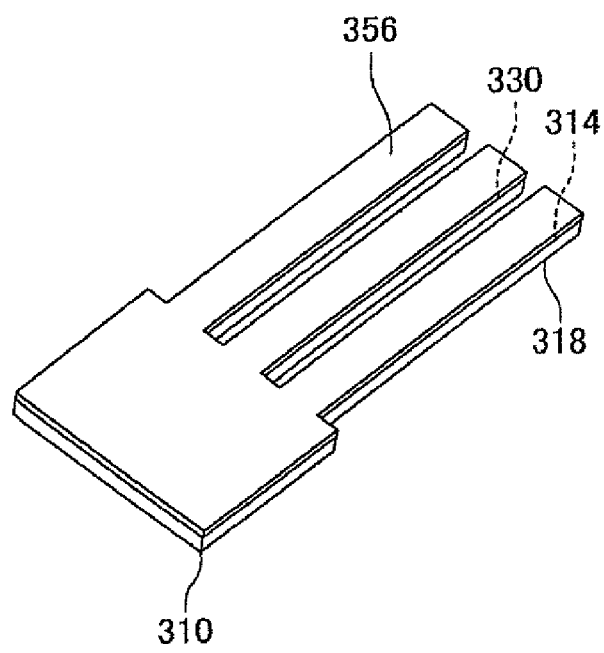
FIG. 8 is a drawing showing a vibrating piece manufacturing method according to a second embodiment of the invention.

FIG. 8 is a drawing showing a vibrating piece manufacturing method according to a second embodiment of the invention. A supporting body 310 prepared in this embodiment is the same as the supporting body 10 prepared in the first embodiment except that no weight metal films are formed on a second surface 314. In this case, all of the second surface 314 of each of arms 318 may be an exposed area 330 where the material of the supporting body 310 is exposed.

In this embodiment, a reinforcing metal film 356 is formed on each of the exposed areas 330 of the second surfaces 314. For example, by depositing $SiO_2$, Au, Cr, Al or the like, the reinforcing films 356 are formed. The reinforcing films 356 make the multiple arms 318 less flexible in the thickness direction. That is, a portion including an arm 318 and a reinforcing metal film 356 is larger in thickness than the original arm 318. As a result, the rigidity is increased so that the frequency is increased. By adopting this embodiment, the arms 318 are made less flexible so that the vibration frequency is controlled. A method for manufacturing a vibrator using a vibrating piece manufactured using the manufacturing method according to this embodiment may be the method described in the first embodiment.

The present invention is not limited to the above-mentioned embodiments and various modifications can be made to the embodiments. For example, the invention includes configurations (for example, same configurations in function, method, and result, or same configurations in object and result) that are substantially the same as the configurations described in the above-mentioned embodiments. Also, the invention includes configurations in which non-substantial parts of the configurations described in the above-mentioned embodiments are replaced. Also, the invention includes configurations that have the same effects and advantages as those of the configurations described in the above-mentioned embodiments and configurations that achieve the same object as that of the configurations described in the above-mentioned embodiments. Also, the invention includes configurations that are combinations of the configurations described in the above-mentioned embodiments and known technologies.

Japanese Patent Application No. 2008-005768 is incorporated by reference in its entirety herein.

What is claimed is:

1. A vibrating piece manufacturing method, comprising:
   (a) preparing a supporting body having first and second surfaces, the first and second surfaces defining a thickness while being directed toward opposite directions, the supporting body including a base and a plurality of arms, the arms extending side-by-side in a direction orthogonal to a direction of the thickness from the base, a lower electrode film being disposed on the first surface of each of the arms, a piezoelectric film being disposed on the lower electrode films, at least one upper electrode film being disposed on the piezoelectric film, at least a part of the second surface of each of the arms being an exposed area; and
   (b) etching the exposed area of the second surface so as to reduce the thickness to reduce flexural rigidity of the arms with respect to the thickness direction, wherein:
   before step (b), a weight metal film is formed on the second surface of each of the arms,
   in step (b), a surface of the weight metal film is also etched, and
   in step (b), steps are formed between a part of the second surface of each of the arms covered by the weight metal film and surfaces of etched parts of each of the arms.

2. The vibrating piece manufacturing method according to claim 1, wherein
   the supporting body is made of a piezoelectric material.

3. A vibrator manufacturing method comprising:
   (a) preparing a supporting body having first and second surfaces, the first and second surfaces defining a thickness while being directed toward opposite directions, the supporting body including a base and a plurality of arms, the arms extending side-by-side in a direction orthogonal to a direction of the thickness from the base, a lower electrode film being disposed on the first surface of each of the arms, a piezoelectric film being disposed on the lower electrode films, at least one upper electrode film being disposed on the piezoelectric film, at least a part of the second surface of each of the arms being an exposed area;
   (b) etching the exposed area of the second surface so as to reduce the thickness to reduce flexural rigidity of the arms with respect to the thickness direction, wherein:
   before step (b), a weight metal film is formed on the second surface of each of the arms,
   in step (b), a surface of the weight metal film is also etched, and
   in step (b), steps are formed between a part of the second surface of each of the arms covered by the weight metal film and surfaces of etched parts of each of the arms;
   (c) incorporating a vibrating piece manufactured by performing steps (a) and (b), into a package; and
   (d) covering an opening of the package with a lid.

* * * * *